United States Patent [19]
Zejda

[11] Patent Number: 5,913,652
[45] Date of Patent: Jun. 22, 1999

[54] CONVEYING APPARATUS

[76] Inventor: Jaroslav Zejda, Aloys-Ruppel-Strasse 4a 63517, Rodenbach, Germany

[21] Appl. No.: 08/936,715

[22] Filed: Sep. 24, 1997

Related U.S. Application Data

[63] Continuation of application No. 08/631,565, Apr. 12, 1996, abandoned.

[30] Foreign Application Priority Data

Apr. 14, 1995 [DE] Germany .............................. 195 14 037

[51] Int. Cl.[6] .................................................. B65H 5/12
[52] U.S. Cl. ....................... 414/225; 198/346.2; 414/939
[58] Field of Search .................................. 414/222, 223, 414/225, 935, 939; 198/346.2

[56] References Cited

U.S. PATENT DOCUMENTS

| | | | |
|---|---|---|---|
| 3,675,563 | 7/1972 | Metreaud | 95/89 R |
| 4,485,759 | 12/1984 | Brandolf | 118/503 |
| 4,695,215 | 9/1987 | Jacoby et al. | 414/225 |
| 4,881,863 | 11/1989 | Braginsky | 414/935 X |
| 4,969,790 | 11/1990 | Petz et al. | 414/217 |
| 5,174,067 | 12/1992 | Hasegawa et al. | 414/935 X |
| 5,232,505 | 8/1993 | Novak et al. | 414/222 X |
| 5,411,588 | 5/1995 | Diepens et al. | 118/666 |
| 5,451,130 | 9/1995 | Kemp | 414/27 |

*Primary Examiner*—Donald W. Underwood

[57] ABSTRACT

The invention relates to a turntable 12, which is driven at a constant timing frequency, which depends on the duration of the longest working time at a process station. The substrate 2 can be delivered by means of the pivoted substrate gripper 13 to one or several process stations or satellite process stations 4 and/or an outlet station 3 or a depositing station 29 or 14 provided outside of the turntable 12.

5 Claims, 2 Drawing Sheets

CONVEYING APPARATUS

This application is a continuation of application Ser. No. 08/631,565, filed Apr. 12, 1996 and now abandoned.

BACKGROUND OF THE INVENTION

The invention relates to a conveying apparatus for the transport of substrates, which includes a turntable, a transfer station, and several process stations for receiving the substrate. The receiving and the transfer of the substrate from the turntable is accomplished by substrate grippers, which can be driven.

U.S. Pat. No. 5,232,505 discloses an apparatus for automatically casting, loading, lacquering, testing and sorting workpieces, to which several process stations belong. This apparatus has a substrate conveying facility with a transporting carriage, which can be moved back and forth along a straight line and to which further carriages with carrying arms are assigned. Aside from the first conveying apparatus, a further conveying apparatus is provided, which is constructed as a turntable and has numerous stations, on which the substrates can be deposited. The conveying apparatus, constructed as a turntable, is loaded with substrates by means of transporting carriages working linearly. Each second or each third station is assigned to a process station, in which the individual substrates are handled, until they are finally ejected at a depositing station. The transfer of the substrate between the receiving station and the turntable or between the turntable and the corresponding process stations of the linearly operating conveying apparatuses is accomplished with substrate grippers, the height of which is adjustable. Since not every depositing station has a process station assigned to it, such a conveying apparatus is at idle at least some of the time. Moreover, such an installation requires much space, particularly due to the linearly operating conveying apparatuses.

SUMMARY OF THE INVENTION

It is an object of the invention to accommodate the conveying apparatus and the individual stations for receiving the substrate in the smallest possible space.

Pursuant to the invention, the turntable is driven at a constant timing frequency which depends on the longest period that a process station is operated. Substrates are supplied by means of a pivoted substrate gripper to one or more satellite process stations, a transfer station, and a depositing station provided outside of the turntable. Due to the use of the turntable in conjunction with the substrate grippers, which are constructed so that they can be pivoted and adjusted in height, numerous stations can be accommodated in a space-saving manner at the periphery of the turntable. With this, the possibility is also provided of assigning a process station or process apparatus to each depositing station. The transfer of substrate between the process station and the depositing station can be accomplished, if necessary, through the use of the pivoted substrate grippers. Moreover, it is possible that the process stations protrude so far beyond the turntable, that the turntable passes through the individual process stations or working appliances from below. Since the turntable is driven at approximately the same timing frequency, the substrates can be placed at short notice precisely below the individual process appliances and, moreover, for such a length of time until every working operation is carried out. After that, the substrate migrates to the next process station. Since a substrate is deposited on each depositing station and, at the same time, the process apparatus can also be assigned to each depositing station, there are no idling times.

It is advantageous that the substrate gripper is constructed with one or several arms and can be pivoted and/or adjusted in height in the region of the conveying apparatus. The process stations, disposed at the periphery of the circularly constructed turntable, can be loaded readily by the pivotably constructed substrate grippers. For this purpose, the substrate holder can be equipped with two or more carrying arms, so that, for the transfer of substrate between the process station and the depositing station, it can merely be raised at short notice, swiveled through an angle of 180° and then lowered again.

If the operating process at a depositing station is very time consuming, the processing time can be halved, for example, by processing the substrates outside of the turntable at two separate, parallel, interacting satellite work stations. The substrate is then delivered from the process stations back to the turntable. By these means, the clock time of the turntable can be reduced appreciably and the timing frequency increased. To shorten the clock time of the turntable, the substrate gripper in each case supplies a substrate to one or several process stations, which are provided outside of the turntable and connected in parallel or in series and on which the same or different operating processes are carried out.

It is of particular importance for the present invention that the number of process stations for receiving the substrate be at least equal to the number of receiving stations provided on the turntable. Since all receiving stations of the turntable can be occupied by a substrate and a process station or processing apparatus is also assigned to each receiving station, a very compact installation is attained.

To shorten the clock time, two or more identical operating processes can be carried out simultaneously in parallel on two or more adjacent process stations. The overall working time for the complete production of the substrate can be decreased as required if processing processes are not to be carried out directly on the turntable in certain cases. By means of the substrate gripper, the substrates can be taken from the turntable in such a case and delivered to a process station, which is provided outside of the turntable. For this purpose, a one-arm or multi-arm substrate gripper is provided in the region of the transfer station, the coating station, the printing station and/or the output station and passes a substrate from the turntable to the satellite station or in the reverse direction.

It is furthermore advantageous if one or more turntables are assigned to the first turntable. The substrates, coming from the first turntable, are delivered at short notice to the second turntable for further processing. Subsequently, they are returned once again to the first turntable or to a third turntable or output station. If, for example, the substrate is to be subjected to special processing, which cannot be carried out on the first turntable for reasons of space, the substrate can be passed to another turntable, which is also driven at a particular timing frequency and equipped with appropriate process stations. After the working cycle on the second turntable, which is provided outside of the central turntable, the substrate can be returned once again to the central turntable. The timing frequency of the central turntable is also affected advantageously by these means, especially if very long working processes must be carried out on the substrate.

It is also possible to equip the turntable with parking stations, on which processing of the substrate does not takes place. It is also possible to provide the parking stations outside of the turntable.

The transfer between the individual turntables is performed by substrate grippers. The parking stations, to which one or several substrate grippers are assigned, can be disposed on a second turntable, which is provided outside the central turntable.

The distances between the individual receiving stations on the turntable can be the same or different and each substrate gripper can take up one or more substrates consecutively or simultaneously. Since a multi-arm substrate gripper in each case has pick-up or suction elements at the end of the individual carrying arms, two or more substrates can be picked up by a single substrate gripper and delivered at short notice to a different process station or also to the depositing station.

The substrate grippers can be mounted to be pivoted horizontally and/or vertically and/or adjusted in height, and are controlled and carry out their working movement as a function of the rotational movement or the timing frequency of the turntable. Due to the different possibilities of adjusting the substrate gripper, the individual process stations, pick-up stations or depositing stations can also be provided on different levels.

So that precise coordination is achieved between the individual motions of the equipment parts, it is advantageous if the central turntable has eight receiving stations, with a process station or transfer station assigned to each receiving station.

It is advantageous if a housing, which is connected to a pump station for producing an elevated pressure, is assigned to the turntable. Since the turntable and the individual process stations are disposed within a housing, the housing can be acted upon with compressed air, which is supplied over only one filter, so that the highest possible cleanliness at the substrate surface is assured and dirt particles are not deposited there.

DETAILED DESCRIPTION OF THE PREFERRED EMBODIMENT

Figure 1:
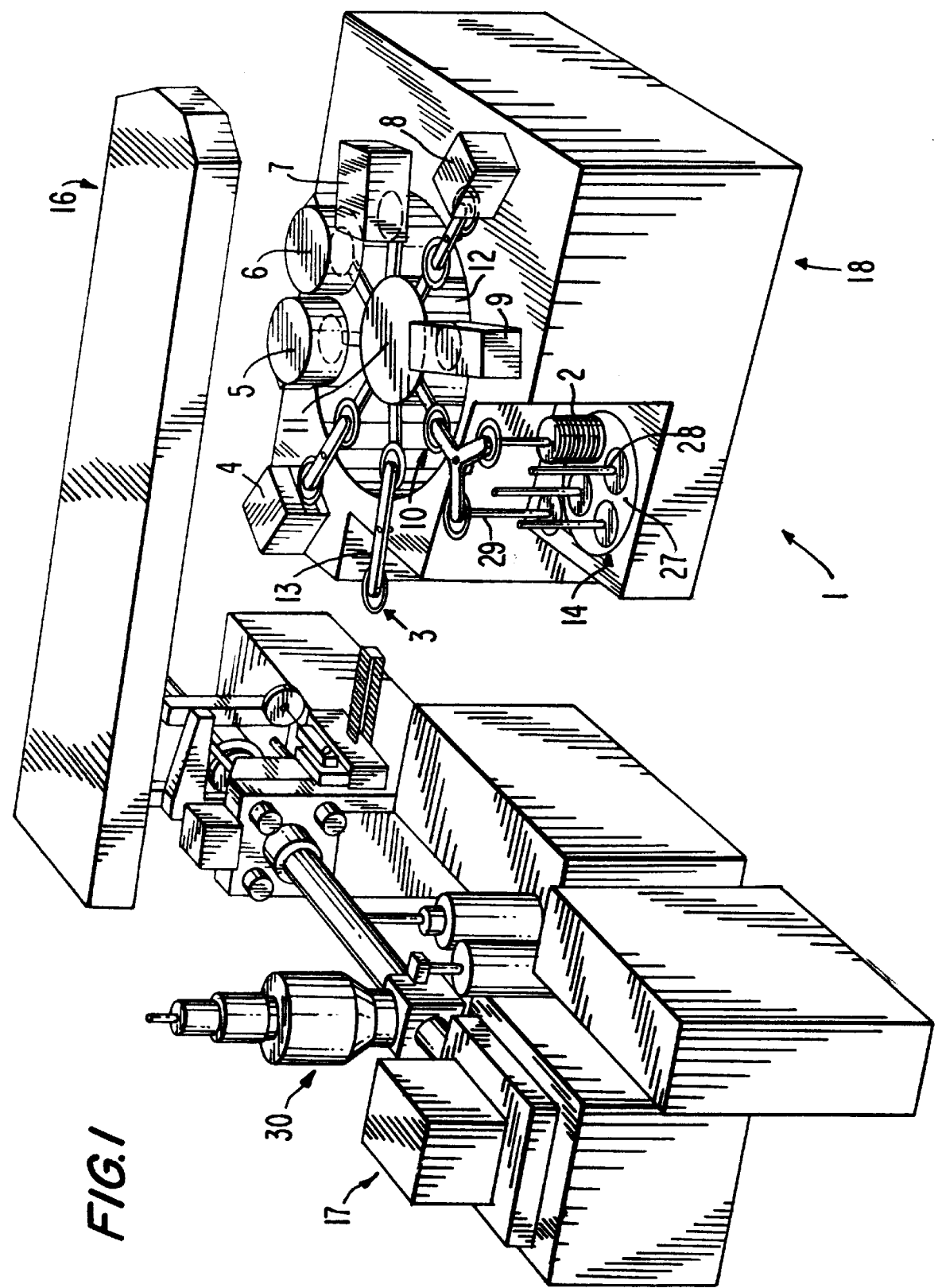
FIG. 1 is a perspective view of the inventive apparatus with a turntable and individual process stations.

The overall apparatus or conveying apparatus 1, shown in FIG. 1, is used to produce compact disks 2 (CDs) fully automatically. The production of the CDs takes place in individual steps. The first part 17 contains an injection molding machine 30 and a transfer station 3 where the substrate 2 is fed into the second part 18 of the installation by means of a substrate gripper 13.

The substrate gripper 13 and processing stations 4–9 are accommodated within a housing 16, which can be closed off on all sides and can be acted upon with a compressed gas or compressed air through a filter, which is not shown in the drawing, in order to achieve the highest possible purity at the surface of the substrate in this way.

Figure 2:
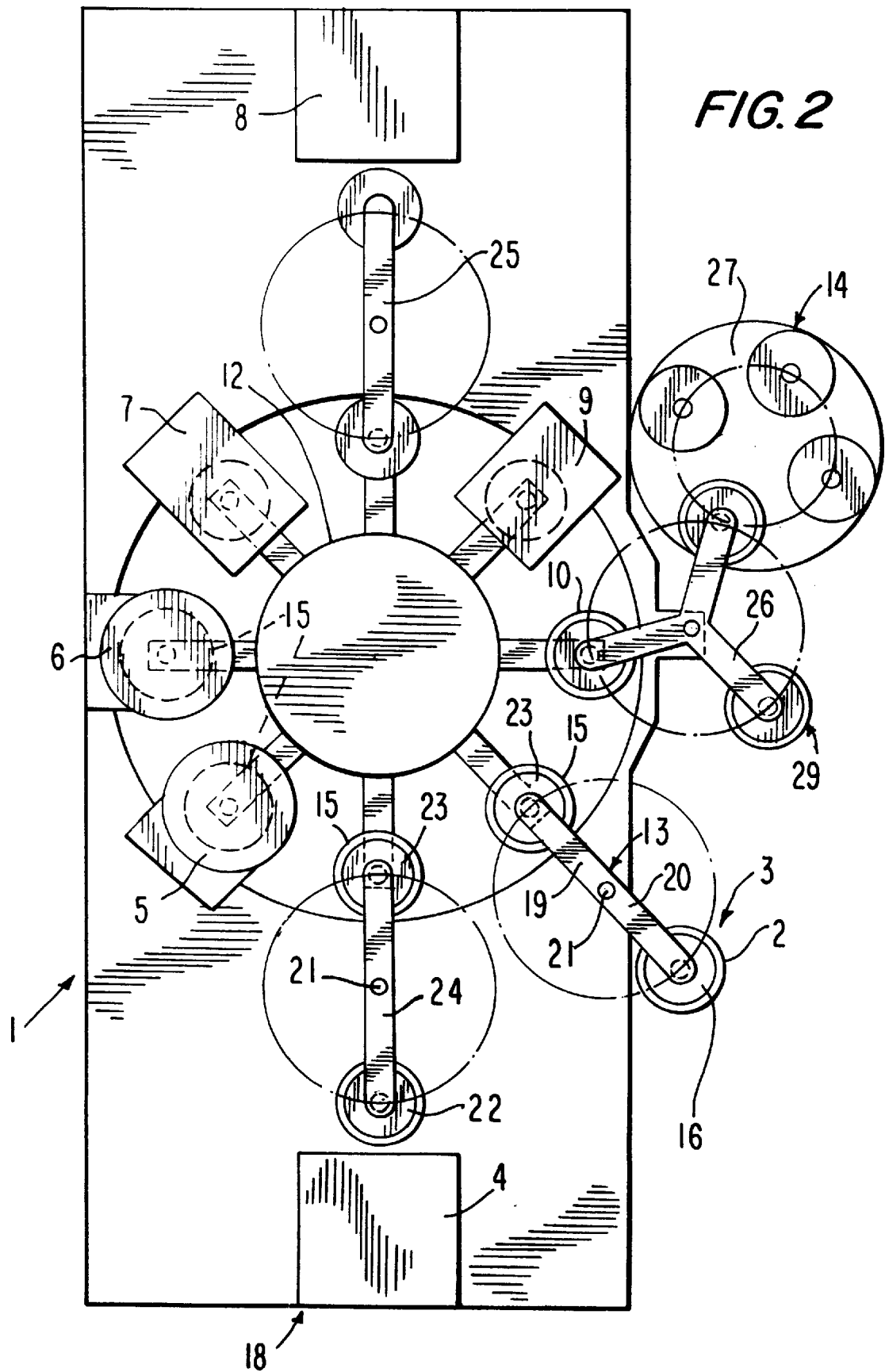
FIG. 2 shows a diagrammatic plan view of the apparatus of FIG. 1.

As is evident from FIGS. 1 and 2, a turntable 12 is rotatable about an axis of rotation 11 in the housing 16, driven by a controllable driving device, not shown in the drawing. The driving device is controlled so that the turntable 12 is driven stepwise with a particular timing frequency determined by the greatest length of time which a substrate 2 is at a process station.

The turntable 12 has a plurality (n) of receiving stations 15 in equidistant distribution and circular arrangement. That is, the receiving stations are spaced at equal angular intervals around the axis of rotation 11. Each station has a diameter which corresponds to that of a CD, and can be held with the aid of pneumatic holding devices.

The substrate 2 is transferred from the transfer station 3 to the receiving station 15 by way of the 2-arm substrate gripper 13. The substrate gripper 13 has two carrying arms 19 and 20, which are rotatably mounted about an axis of rotation 21. At the end of each arm 19 or 20, there is a gripping or suction element 22, 23, so that two CDs can be held simultaneously by the substrate gripper 13. One gripping element 22 is in the region of the transfer station 3 while the other gripping element 23 is above the receiving station 15 of the turntable 12. In this way, by means of the substrate gripper 13, a substrate 2 can be picked up, swiveled through an angle of 180°, and deposited on the turntable 12.

The substrate 2 is passed stepwise to the next process station 4, in this case a sputtering facility, by way of a 2-arm substrate gripper 24. As is evident from FIG. 2, the one gripping element 22 lies outside of the periphery of the turntable 12, so that, by picking up the CD by means of the gripping element 23, the substrate gripper 24 of the substrate 2 can be passed from the turntable 12 to the process station 4. After the coating process, the substrate 2 is removed once again from the vacuum coating facility 4 by means of the gripping element 22 at the same time a new substrate 2 is supplied from the turntable 12 by the gripping element 23 as the substrate gripper 24 is once again swiveled through an angle of 180°.

Process station 5 lies adjacent to process station 4. In process station 5, lacquer is applied to the surface of the substrate 2 by means of a rotary lacquer application method. Process station 6 is a centrifugal lacquering facility by means of which a uniform distribution of the lacquer on the surface of the substrate 2 is achieved. The two process stations 5 and 6, which are indicated only diagrammatically in FIGS. 1 and 2, lie above the turntable 12, so that the loading of the process stations 5 and 6 can take place by turning the turntable 12. After the application of the lacquer in the process station 6 is concluded, the turntable 12 turns the substrate to the next process station 7, which is a multifunctional drying apparatus.

After the substrate surface 2 is dried or cured, the substrate 2 is passed on by means of the turntable 12 to a position adjacent the next process station 8, which is constructed as a printing station with which the imprint on the surface of the substrate 2 is accomplished. The printing facility 8 is loaded by a substrate gripper 25, which is constructed in much the same way as the substrate gripper 13 or 24.

After printing, the substrate 2 is passed by means of the turntable 12 to the control station 9, where the quality of the substrate 2 is checked carefully. The substrate is then moved by the turntable 12 to a transfer station 10 where it is picked by a three arm substrate gripper 26. Substrates which do not meet the quality requirements are delivered to a depositing station 29. Next to the depositing station 29, there is a further depositing station 14, on which CDs of satisfactory quality are deposited. For this purpose, the depositing station 14 consists of a turntable 27 with, for example, four different pins 28 for accommodating the individual substrates 2.

Process stations 5, 6, 7, and 9 are located on a circular path above the turntable while process stations 4 and 8, transfer station 3, and depositing stations 14, 29 are located outside the turntable. The latter, which are served by pivoting gripper arms, will be referred to collectively as satellite stations. There are a total of (n-2) process stations and two transfer stations, so that each receiving station is adjacent to transfer station or a process station after each stepwise rotation of said turntable through the angular interval at which the receiving stations are spaced on the turntable.

For shortening the clock time of the turntable 12, a substrate gripper can in each case deliver a substrate 2 to one of several of the satellite process stations where additional processing operations are carried out. These stations may be served by an additional turntable, as disclosed in FIG. 1 of DE 44 08 537, to which U.S. Pat. No. 5,612,068 corresponds.

To shorten the clock time of the turntable 12, longer lasting working processes can be carried out in parallel. For this purpose, two substrates 2 are removed simultaneously from the turntable 12 and delivered to several processing stations, at which the processing is then carried out in parallel. Since in each case two substrates are being processed simultaneously, the clock time can be reduced by 50% or more. This is of advantage particularly when the working process requires a particularly long time at one place. As already mentioned, such process stations are referred to as satellite stations. Depending on the course of the work, it is also possible to set up a parking station between the process stations, on which a substrate 2 can be deposited. The parking station, which is not shown in the drawing, can be located either on the turntable or outside of the turntable.

The distances between the individual receiving stations 15 are equal, and the timing frequency or cycle time are adapted to the longest duration of work at a process station, for example about 4 seconds. Substrate gripper can be mounted to pivot about a horizontal axis and may also be adjustable in height, in order to make the transport of the substrates between the individual stations as simple as possible. The rotational speed of the individual substrate grippers is also controlled by the timing frequency of the turntable 12, so that a continuous, coordinated course of the process is ensured.

Due to the compact arrangement of the turntable 12 with receiving stations 15 a CD can be finished every four seconds. This is achieved particularly owing to the fact that at all stations the individual working processes take place in parallel. Typically the maximum processing time at a station is 3.5 seconds and the transfer time to the next station is 0.5 seconds.

What is claimed is:

1. A substrate processing apparatus comprising a turntable supported for rotation about an axis of rotation and having a plurality of receiving stations thereon spaced around said axis at equal angular intervals, said receiving stations each being adapted to receive a substrate, a first transfer station served by a first rotatable substrate gripper for delivering a substrate to a receiving station on said turntable when said receiving station is rotated to a position adjacent thereto, a plurality of process stations spaced about said turntable at least two of, said process stations each processing a substrate on a receiving station when said receiving station is rotated to an associated position as said turntable rotates stepwise through said angular intervals, a second transfer station served by a second rotatable substrate gripper for delivering a substrate from a receiving station to a depositing station subsequent to processing at said process stations, at least two of said process stations comprising a satellite process station spaced radially outward of the turntable from the receiving stations and a rotatable gripper capable of holding at least two substrates moving substrates between a receiving station rotated to the associated position and the satellite process station, and said turntable being rotated at a constant cycle frequency that depends on the longest of working times for said process stations.

2. A substrate processing apparatus as in claim 1 wherein said satellite process station is a sputtering station.

3. A substrate processing apparatus as in claim 1 wherein said satellite process station is a printing station.

4. A substrate processing apparatus as in claim 1 wherein said second substrate gripper serving said second transfer station can deliver a substrate from a receiving station to any of a plurality of depositing stations.

5. A substrate processing apparatus as in claim 1 wherein there are eight receiving stations and six process stations comprising coating stations, a drying station, a printing station, and a control station where substrate quality is checked.

* * * * *